(12) United States Patent
Navarro et al.

(10) Patent No.: US 9,296,014 B2
(45) Date of Patent: Mar. 29, 2016

(54) PROCESS FOR CONTROLLING THE PERIOD CHARACTERIZING THE MORPHOLOGY OBTAINED FROM A BLEND OF BLOCK COPOLYMERS AND OF CO(POLYMERS) OF ONE OF THE BLOCKS

(71) Applicant: Arkema France, Colombes (FR)

(72) Inventors: Christophe Navarro, Bayonne (FR); Xavier Chevalier, Grenoble (FR); Celia Nicolet, Talence (FR)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 14/340,075

(22) Filed: Jul. 24, 2014

(65) Prior Publication Data

US 2015/0030971 A1 Jan. 29, 2015

Related U.S. Application Data

(60) Provisional application No. 61/879,899, filed on Sep. 19, 2013.

(30) Foreign Application Priority Data

Jul. 25, 2013 (FR) .................................. 13 57333
Feb. 25, 2014 (FR) .................................. 14 51490

(51) Int. Cl.
*G03F 7/00* (2006.01)
*B05D 3/04* (2006.01)
*G03F 1/68* (2012.01)
*B05D 3/02* (2006.01)
*C08F 2/00* (2006.01)

(Continued)

(52) U.S. Cl.
CPC .............. *B05D 3/046* (2013.01); *B05D 3/0254* (2013.01); *B05D 3/0493* (2013.01); *C08F 2/001* (2013.01); *C08F 297/026* (2013.01); *C09D 153/00* (2013.01); *G03F 1/68* (2013.01); *G03F 7/00* (2013.01); *G03F 7/0002* (2013.01)

(58) Field of Classification Search
CPC .............................. G03F 7/004; C08F 297/00
USPC .......................... 430/270.1; 525/89, 227, 241
See application file for complete search history.

(56) References Cited

U.S. PATENT DOCUMENTS 5,686,534 A 11/1997 Bayard et al.
5,886,112 A * 3/1999 Vuillemin et al. .............. 526/64

(Continued)

FOREIGN PATENT DOCUMENTS

EP 0524054 A1 1/1993
EP 0749987 A1 12/1996

(Continued)

OTHER PUBLICATIONS

French Search Report dated Sep. 22, 2014 for French Application No. 1451492.

(Continued)

*Primary Examiner* — Amanda C Walke
(74) *Attorney, Agent, or Firm* — RatnerPrestia

(57) ABSTRACT

The present invention relates to a process for controlling the period characterizing the morphology obtained from a blend of block copolymers and of (co)polymers of one of the blocks on a surface employing a particular way of carrying out the synthesis of the blend of block copolymers and of (co)polymers of one of the blocks.

18 Claims, 5 Drawing Sheets

(51) Int. Cl.
C08F 297/02 (2006.01)
C09D 153/00 (2006.01)

(56) References Cited

U.S. PATENT DOCUMENTS

| | | | |
|---|---|---|---|
| 6,911,511 B1* | 6/2005 | Bertin | 526/227 |
| 6,953,649 B2 | 10/2005 | Prat et al. | |
| 6,991,741 B2 | 1/2006 | Bullock | |
| 7,084,209 B2* | 8/2006 | Everaerts et al. | 525/98 |
| 7,521,094 B1 | 4/2009 | Cheng | |
| 7,723,009 B2* | 5/2010 | Sandhu et al. | 430/270.1 |
| 7,790,350 B2* | 9/2010 | Breyta et al. | 430/270.1 |
| 2004/0157994 A1* | 8/2004 | Kubo et al. | 525/88 |
| 2007/0219329 A1* | 9/2007 | Po et al. | 526/217 |
| 2008/0193658 A1 | 8/2008 | Millward | |
| 2009/0236309 A1* | 9/2009 | Millward et al. | 216/39 |
| 2010/0323096 A1* | 12/2010 | Sills et al. | 427/58 |
| 2011/0039061 A1* | 2/2011 | Fedynyshyn et al. | 428/119 |
| 2011/0224373 A1* | 9/2011 | Carpentier et al. | 525/90 |
| 2011/0257289 A1* | 10/2011 | Biggs et al. | 523/102 |
| 2012/0164392 A1 | 6/2012 | Stoykovich et al. | |
| 2012/0202017 A1 | 8/2012 | Nealey | |
| 2013/0209696 A1 | 8/2013 | Sharma | |
| 2013/0209755 A1 | 8/2013 | Hustad | |
| 2013/0230705 A1* | 9/2013 | Nealey et al. | 428/201 |
| 2014/0072722 A1* | 3/2014 | Kawanishi et al. | 427/532 |
| 2014/0127418 A1 | 5/2014 | Navarro | |
| 2014/0197133 A1* | 7/2014 | Montarnal et al. | 216/49 |

FOREIGN PATENT DOCUMENTS

| | | |
|---|---|---|
| FR | 2809829 A | 12/2001 |
| WO | 2008097736 | 8/2008 |
| WO | 2009151834 | 12/2009 |
| WO | 2012140383 | 10/2012 |
| WO | WO 2013/120052 A1 * | 8/2013 |

OTHER PUBLICATIONS

Entire patent prosecution history of U.S. Appl. No. 14/481,410, filed Sep. 9, 2014, entitled, Process for Controlling the Period of a Nanostructured Assemblage Comprising a Blend of Block.

Entire patent prosecution history of U.S. Appl. No. 14/481,421, filed Sep. 9, 2014, entitled, "Process for Producing Thick Nanostructured Films Obtained From a Block Copolymer Composition."

French Search Report dated Jul. 22, 2014 for French Application No. 1451491.

French Search Report dated May 16, 2014 for French Application No. 1358628.

Hadziioannou et al, "Structural Study of Mixtures of Styrene/Isoprene Two- and Three-Block Copolymers", Macromolecules, 1982, 15, pp. 267-271.

Kane, et al, "Phase Behavior and Morphological Characteristics of Compositionally Symmetric Diblock Copolymer Blends", Macromolecules, 1996, 29, pp. 8862-8870.

Koizumi, et al, "Ordered Structure in Blends of Block Copolymers. 3. Self-Assembly in Blends of Sphere- or Cylinder-Forming Copolymers", Macromolecules, 1994, 27, pp. 4371-4381.

Sivaniah, et al, "Symmetric Diblock Copolymer Thin Films on Rough Substrates: Microdomain Periodicity in Pure and Blended Films", Macromolecules, 2008, 41, pp. 2584-2592.

Yamaguchi, et al, "A Phase Diagram for the Binary Blends of Nearly Symmetric Diblock Copolymers. 1. Parameter Space of Molecular Weight Ratio and Blends Composition", Macromolecules, 2001, 34, pp. 6495-6505.

Zhang, et al, "Rapid Assembly of Nanolines with Precisely Controlled Spacing from Binary Blends of Block Copolymers", Macromolecules, 2011, 44, pp. 9752-9757.

Campbell et al., "Network Connectivity and Long-Range Continuity of Lamellar Morphologies in Block Copolymer Thin Films," Macromolecules 2012, 45, 1587-1597, Jan. 23, 2012.

Office Action for U.S. Appl. No. 14/481,421 mailed Jan. 27, 2015.

Karim Aissou, et al. ; "*Phase Behavior in Thin Films of Cylinder-Forming Diblock Copolymer: Deformation and Division of Heptacoordinated Microdomains*"; 2007 © American Chemical Society; Macromolecules 2007; vol. 40, Nov. 14, 2007; pp. 5045-5059.

Rachel A. Segalman, et al.; "*Graphoepitaxy of Spherical Domain Block Copolymer Films*"; Adv. Mater. 2001, 13, No. 15, Aug. $3^{rd}$.

Tiron, et al. ; "*Optimization of Block Copolymer Self-Assembly Through Graphoepitaxy: A Defectivity Study*"; J. Vac. Technol. B, vol. 29(6), Nov./Dec. 2011.

P. Mansky, et al.; "*Controlling Polymer-Surface Interactions With Random Copolymer Brushes*"; Science 275, 1458 (1997); DOI: 10.1126/Science.275.5305.1458.

Unyong Jeong, et al; "*Enhancement in the Orientation of the Microdomain in Block Copolymer Thin Films Upon the Addition of Homopolymer*"; Adv. Mater, 2004; 16, No. 6, Mar. 18.

Hirofumi Kitano, et al. ; "*Control of the Mircodomain Orientation in Block Copolymer Thin Films with Homopolymers for Lithographic Application*"; 2007 © American Chemical Society; Langmuir 2007; 23, 6404-6410.

Search Report Issued by the French Patent Office for Application No. 1357333, Dated Apr. 1, 2014.

Andrew J. Peters, et al; "*Effects of Block Copolymer Polydispersity and xN on Pattern Line Edge Roughness and Line Width Roughness from Directed Self-Assembly of Diblock Copolymers*"; Proc. Of SPIE vol. 8680 868020-1.

Karen I. Winey, et al; "*Swelling a Lamellar Diblock Copolymer With Homopolymer: Influences of Homopolymer Concentration and Molecular Weight*"; 1991 © American Chemical Society; Macromolecules 1991, 24, 6182-6188.

M.W. Matsen; "*Phase Behavior of Block Copolymer/Homopolymer Blends*"; 1995 © American Chemical Society; Macromolecules 1995, 28, 5765-5773.

Naoya Torikai, et al; "*Lamellar Domain Spacings of Diblock Copolymer/Homopolymer Blends and Conformations of Block Chains in Their Microdomains*"; 1997 © American Chemical Society; Macromolecules 1997, 30, 5698-5703.

Dae Up Ahn, et al; "*Fabrication of Well-Defined Block Copolymer Nano-Cylinders by Controlling the Thermodynamics and Kinetics Involved in Block Copolymer Self-Assembly*"; Soft Matter, 2008, 4, 1454-1466; The Royal Society of Chemistry 2008.

Su-Mi Hur et al; "*SCFT Simulations of Thin Film Blends of Block Copolymer and Homopolymer Laterally Confined in a Square Well*"; © 2009 American Chemical Society; Macromolecules 2009, 42, 5861-5872; DOI: 10.1021/ma900519r.

Weihua Li, et al; "*Ordering Dynamics of Directed Self-Assembly of Block Copolymers in Periodic Two-Dimensional Fields*"; © 2010 American Chemical Society; Macromolecules 2010, 43, 1644-1650; DOI: 10.1021/ma3023203.

Final Office Action for U.S. Appl. No. 14/481,410 mailed Jun. 8, 2015.

* cited by examiner

Pure PS-b-PMMA diblock, 69,5% PS
Thickness ~30 nm
L₀~43.2nm

PS-b-PMMA diblock
+30% of PS homo
69,2% PS
Thickness ~47 nm
L₀~43.07nm

Scanning microscopy image

Binarized image

Analysis of the defects:
Defects of coordination number = 54

Analysis of the defects:
Defects of distance = 14

PROCESS FOR CONTROLLING THE PERIOD CHARACTERIZING THE MORPHOLOGY OBTAINED FROM A BLEND OF BLOCK COPOLYMERS AND OF CO(POLYMERS) OF ONE OF THE BLOCKS

CROSS-REFERENCE TO RELATED APPLICATIONS

This application claims benefit of priority of the following applications, each of which is incorporated herein by reference in its entirety for all purposes: French Application No. 13.57333, filed Jul. 25, 2013; U.S. Provisional Application No. 61/879,899, filed Sep. 19, 2013; and French Application No. 14.51490, filed Feb. 25, 2014.

FIELD OF THE INVENTION

The present invention relates to a process for controlling the period characterizing the morphology obtained from a blend of block copolymers and of (co)polymers of one of the blocks on a surface employing a particular way of carrying out the synthesis of the blend of block copolymers and of the (co)polymers of one of the blocks.

DISCUSSION OF THE RELATED ART

The term "period" is understood to mean the minimum distance separating two neighbouring domains with the same chemical composition, which are separated by a domain with a different chemical composition.

Due to their ability to develop a nanostructure, the use of block copolymers in the fields of electronics or optoelectronics is now well known. This new technology allows access to advanced nanolithography processes with resolutions in terms of domain size of the order of a few nanometres.

It is in particular possible to structure the arrangement of the blocks constituting the copolymers at scales far below 50 nm.

The desired structuring (for example, generation of the domains perpendicular to the surface) requires specific conditions, such as the preparation of the surface, but also the composition of the block copolymer. Whatever the chemical nature of the blocks, the ratio by weight of the blocks or their length, optimization is generally required in order to obtain a morphology as close as possible to the requirements of industry, without defect, and reproducibly. In point of fact, from an industrial viewpoint, it is known that it is very difficult, indeed even impossible, to reproduce exactly the synthesis of such block copolymers.

In Proc. of SPIE, Vol. 8680, Alternative Lithographic Technologies V, 86801Z, 2013, Lawson et al. mention up to 10-15% variation in molecular weight from one synthesis to another, resulting, for 10% variation in molecular weight, in up to 6% difference with regard to the period characterizing the morphology, which is unacceptable industrially for lithographic applications intended for the electronics industry.

Some authors have studied the effect which might be had by the addition of one or more homopolymers to the block copolymer.

In Macromolecules, 1991, 24, 6182-6188, Winey K. et al. discuss this effect on lamellar morphologies, in particular the thickness of the lamellae and layers, in a polystyrene-b-polyisoprene system in the presence of homopolystyrene.

In Macromolecules, 1995, 28, 5765-5773, Matsen M. studies, by SCFT (self-consistent field theory) simulation, the behaviour of the blends of block copolymers with a (co)polymer. These simulations show that the addition of homopolymer influences the final morphology of the blend, which can range up to stabilization of the hexagonal morphology.

In Macromolecules, 1997, 30, 5698-5703, Torikai N. et al., still in lamellar morphologies, present a similar study where they show the effect which might be had by the molecular weight of the homopolymer added. The system studied is polystyrene-b-polyvinylpyridine in the presence of polystyrene or polyvinylpyridine.

In Adv. Mater., 2004, 16, No. 6, 533-536, Russel et al. demonstrate that the addition of polymethyl methacrylate (PMMA) to a polystyrene-b-polymethyl methacrylate copolymer (PS-b-PMMA), with a size of the polymethyl methacrylate homopolymer slightly greater than that of the polymethyl methacrylate block of the corresponding block copolymer, makes it possible to obtain a perpendicular cylindrical morphology independent of the thickness of the film.

More recently, in Langmuir, 2007, 23, 6404-6410, Kitano H. et al. report favoured perpendicular control of cylindrical domains by addition of polystyrene homopolymers to polystyrene-b-polymethyl methacrylate. They suggest that this property originates from the decrease in the stress of the hexagonal symmetry during the addition of polystyrene. The same effect is demonstrated by the addition of polymethyl methacrylate.

In Soft Matter, 2008, 1454-1466, Up Ahn D. et al. also present a similar discussion by centring their studies on the effect of the molecular weight of the homopolymer added to the block copolymer on the size, the stability and the periodicity of the cylinders.

Finally, in Macromolecules, 2009, 42, 5861-5872, Su-Mi Hur et al. study simulations of morphologies resulting from blends of block copolymers and of homopolymer. They demonstrate that the addition of copolymer makes it possible to achieve a stable tetragonal symmetry, which is not the case with the pure block copolymer.

These combined studies show that it is possible to adjust the period and the morphology of a blend of block copolymers and of homopolymers. However, it appears difficult to make use of this knowledge on the industrial scale, in particular because the block copolymers differ slightly from one synthesis to another and because, for each block copolymer, the size of a homopolymer which makes possible adjustment of the period has to be controlled and a synthesis does not guarantee that the target which makes possible the desired adjustment will be obtained. Furthermore, when the homopolymers having a size of less than or greater than the size of the corresponding block are added, this considerably reduces the composition window allowing a given morphology.

It consequently remains desirable to have available a much simpler method which makes it possible to obtain a composition of a block copolymer/homopolymer or (co)polymer of one of the blocks which reproducibly guarantees the periodicity of the morphology of the blend under consideration once deposited on a surface.

BRIEF SUMMARY OF THE INVENTION

This difficulty is now circumvented by the use of a process for the synthesis of polymers which allows the synthesis of the block copolymer and of the (co)polymer of one of the blocks within one and the same process, preferably continuous or semicontinuous. This process, discovered by the inventors, additionally exhibits the advantage of synthesizing a (co)polymer having a molecular weight identical to that of one of the blocks corresponding to the block copolymer, which widens the composition window within a given morphology. In addition, when the process is made use of continuously or semicontinuously, a drift in the process resulting in a drift in the molecular weights can easily be corrected by a modification to the (co)polymer/block copolymer ratio. In the end, during the establishment of the morphology of the blend on a surface, a morphology is always obtained, the characteristic period of which is identical. In addition, by using the process of the invention, it is possible to access ranges of periods characterizing the morphology extending from a few nm up to more than 60 nm. Other advantages are that this approach makes possible very good stabilization of the morphology by decrease in the tensions on the polymer chains within a self-assembly structure and it increases the possibilities of assembling by plasticizing action of the (co) polymer in combination with the block copolymer. A decrease in the number of defects for large film thicknesses in templates different from a hexagonal symmetry, such as a square symmetry, for example, is also observed. Finally, the chosen approach makes it possible to obtain a blend, the (co)polymer of which has the same molecular weight as that of one of the blocks of the block copolymer, for this reason preventing a macroscopic phase separation with a (co)polymer of excessively high weight or a decrease in the period characterizing the morphology with a (co)polymer of excessively low weight. In the process which is a subject-matter of the invention, the (co)polymer will never be either too small or too large for the block copolymer. In the process which is a subject-matter of the invention, the ratio of the respective weights of the (co)polymer and of the block copolymer being constant, whatever the targeted molecular weight of the block copolymer, the change in the period characterizing the morphology remains equivalent.

The invention relates to a process for controlling the period characterizing the morphology obtained starting from a blend of block copolymers and of (co)polymers of one of the blocks in thin films comprising the following stages:

synthesis of the block copolymer so that the product of the synthesis comprises the said block copolymer and a (co)polymer of one of the blocks, deposition of a solution of the blend of the block copolymer and of the (co)polymer on a surface, evaporation of the solvent, annealing.

DETAILED DESCRIPTION OF CERTAIN EMBODIMENTS OF THE INVENTION

Figure 1:
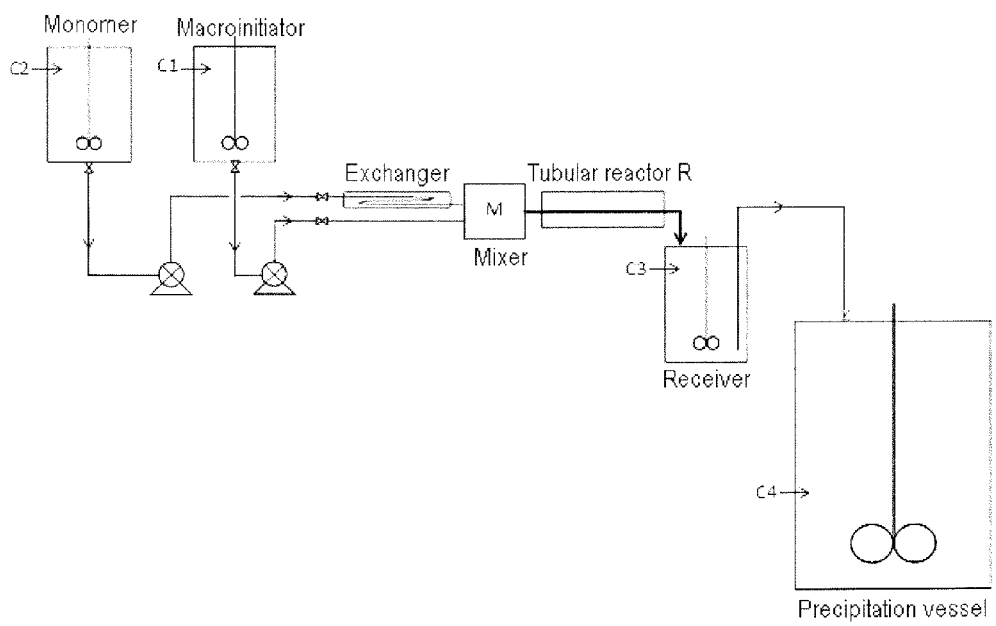
FIG. 1 represents diagrammatically the equipment used for the polymerization in Example 1.

Further to control the period, the present invention allows film fabrication with a minimum of orientation, coordination number or distance defect and with large monocrystalline surfaces.

The nanostructuring of a block copolymer of a surface treated by the process of the invention can take the forms such as cylindrical (hexagonal symmetry (primitive hexagonal lattice symmetry "6 mm") according to the Hermann-Mauguin notation, or tetragonal symmetry (primitive tetragonal lattice symmetry "4 mm")), spherical (hexagonal symmetry (primitive hexagonal lattice symmetry "6 mm" or "6/mmm"), or tetragonal symmetry (primitive tetragonal lattice symmetry "4 mm"), or cubic symmetry (lattice symmetry "m$\bar{3}$m")), lamellar or gyroidal. Preferably, the preferred shape which the nanostructuring takes is of the hexagonal cylindrical type.

The process for the self-assembling of block copolymers on a surface treated according to the invention is governed by thermodynamic laws. When the self-assembling results in a morphology of cylindrical type, each cylinder is surrounded by 6 equidistant neighbouring cylinders if there is no defect. Several types of defects can thus be identified. The first type is based on the evaluation of the number of neighbours around a cylinder which constitutes the arrangement of the block copolymer, also known as coordination number defects. If five or seven cylinders surround the cylinder under consideration, a coordination number defect will be regarded as being present. The second type of defect considers the mean distance between the cylinders surrounding the cylinder under consideration [W. Li, F. Qiu, Y. Yang and A. C. Shi, Macromolecules, 43, 2644 (2010); K. Aissou, T. Baron, M. Kogelschatz and A. Pascale, Macromol., 40, 5054 (2007); R. A. Segalman, H. Yokoyama and E. J. Kramer, Adv. Matter., 13, 1152 (2003); R. A. Segalman, H. Yokoyama and E. J. Kramer, Adv. Matter., 13, 1152 (2003)]. When this mean distance between two neighbours is greater than two % of the mean distance between two neighbours, a defect will be regarded as being present. In order to determine these two types of defects, use is conventionally made of the associated Voronoi constructions and Delaunay triangulations. After binarization of the image, the centre of each cylinder is identified. The Delaunay triangulation subsequently makes it possible to identify the number of first-order neighbours and to calculate the mean distance between two neighbours. It is thus possible to determine the number of defects. This counting method is described in the paper by Tiron et al. (J. Vac. Sci. Technol. B, 29(6), 1071-1023, 2011).

A final type of defect relates to the angle of cylinders of the block copolymer which is deposited on the surface. When the block copolymer is no longer perpendicular to the surface but lying down parallel to the latter, a defect of orientation is regarded as having appeared.

The synthesis of block copolymers is a sequential synthesis. Whether radical, cationic or anionic polymerization, a first block with monomers of a first type is first synthesized and then, in a second step, the monomers of the other blocks are introduced. In the present invention, even if there is no restriction on the number of blocks of the block copolymer, the synthesis of triblock or diblock copolymers will be considered in particular and preferably the synthesis of diblock copolymers.

The principle consists in controlling the deactivation of a portion of the first block synthesized in the first stage by any chemical method known to a person skilled in the art. In this way, during the synthesis of the subsequent block or blocks, only the active blocks of the first stage will result in the formation of the block copolymer, the deactivated blocks remaining in the form of a (co)polymer.

According to an alternative form of the invention, it will also be possible to separate a portion of the block prepared in the first stage, to deactivate it and to introduce it into the final blend. However, as this alternative form requires additional handling operations, it is not the easiest to implement on the industrial scale.

When the process of the invention is carried out continuously or semicontinuously, analyses carried out throughout the process will make it possible to determine the molecular weight of the polymers synthesized. Using graphs which make it possible to determine the relationship between the composition and the period characterizing the morphology once the blend is deposited on a surface, it is possible to modify the content of (co)polymer in the final blend, whether by varying the parameters for deactivation of the active centres or by injecting a portion of the block of the first stage via a bypass line into the final blend, so that the blend obtained results in a period characterizing the morphology once the blend is deposited on an unchanging surface.

When the polymerization process is carried out via a controlled radical route, any controlled radical polymerization technique can be used, whether NMP ("Nitroxide Mediated Polymerization"), RAFT ("Reversible Addition and Fragmentation Transfer"), ATRP ("Atom Transfer Radical Polymerization"), INIFERTER ("Initiator-Transfer-Termination"), RITP ("Reverse Iodine Transfer Polymerization") or ITP ("Iodine Transfer Polymerization"). Preferably, the process for polymerization by a controlled radical route will be carried out by NMP.

More particularly, the nitroxides resulting from the alkoxyamines derived from the stable free radical (1) are preferred,

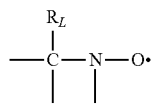

(1)

in which the radical $R_L$ exhibits a molar mass of greater than 15.0342 g/mol. The radical $R_L$ can be a halogen atom, such as chlorine, bromine or iodine, a saturated or unsaturated and linear, branched or cyclic hydrocarbon group, such as an alkyl or phenyl radical, or an ester —COOR group or an alkoxyl-OR group, or a phosphonate —PO(OR)$_2$ group, provided that it exhibits a molar mass of greater than 15.0342. The radical $R_L$, which is monovalent, is said to be in the β position with respect to the nitrogen atom of the nitroxide radical. The remaining valences of the carbon atom and of the nitrogen atom in the formula (1) can be connected to various radicals, such as a hydrogen atom or a hydrocarbon radical, such as an alkyl, aryl or arylalkyl radical, comprising from 1 to 10 carbon atoms. It is not ruled out for the carbon atom and the nitrogen atom in the formula (1) to be connected to one another via a divalent radical, so as to form a ring. However, preferably, the remaining valences of the carbon atom and of the nitrogen atom of the formula (1) are connected to monovalent radicals. Preferably, the radical $R_L$ exhibits a molar mass of greater than 30 g/mol. The radical $R_L$ can, for example, have a molar mass of between 40 and 450 g/mol. By way of example, the radical $R_L$ can be a radical comprising a phosphoryl group, it being possible for the said radical $R_L$ to be represented by the formula:

(2)

in which $R^3$ and $R^4$, which can be identical or different, can be chosen from alkyl, cycloalkyl, alkoxyl, aryloxyl, aryl, aralkyloxyl, perfluoroalkyl or aralkyl radicals and can comprise from 1 to 20 carbon atoms. $R^3$ and/or $R^4$ can also be a halogen atom, such as a chlorine or bromine or fluorine or iodine atom. The radical $R_L$ can also comprise at least one aromatic ring, such as for the phenyl radical or the naphthyl radical, it being possible for the latter to be substituted, for example by an alkyl radical comprising from 1 to 4 carbon atoms.

More particularly, the alkoxyamines derived from the following stable radicals are preferred:
N-(tert-butyl)-1-phenyl-2-methylpropyl nitroxide,
N-(tert-butyl)-1-(2-naphthyl)-2-methylpropyl nitroxide,
N-(tert-butyl)-1-diethylphosphono-2,2-dimethylpropyl nitroxide,
N-(tert-butyl)-1-dibenzylphosphono-2,2-dimethylpropyl nitroxide,
N-phenyl-1-diethylphosphono-2,2-dimethylpropyl nitroxide,
N-phenyl-1-diethylphosphono-1-methylethyl nitroxide,
N-(1-phenyl-2-methylpropyl)-1-diethylphosphono-1-methylethyl nitroxide,
4-oxo-2,2,6,6-tetramethyl-1-piperidinyloxy,
2,4,6-tri(tert-butyl)phenoxy.

Preferably, the alkoxyamines derived from N-(tert-butyl)-1-diethylphosphono-2,2-dimethylpropyl nitroxide will be used.

The constituent monomers of the polymers will be chosen from the following monomers: at least one vinyl, vinylidene, diene, olefinic, allyl or (meth)acrylic monomer. This monomer is more particularly chosen from vinylaromatic monomers, such as styrene or substituted styrenes, in particular α-methylstyrene, acrylic monomers, such as acrylic acid or its salts, alkyl, cycloalkyl or aryl acrylates, such as methyl, ethyl, butyl, ethylhexyl or phenyl acrylate, hydroxyalkyl acrylates, such as 2-hydroxyethyl acrylate, ether alkyl acrylates, such as 2-methoxyethyl acrylate, alkoxy- or aryloxypolyalkylene glycol acrylates, such as methoxypolyethylene glycol acrylates, ethoxypolyethylene glycol acrylates, methoxypolypropylene glycol acrylates, methoxypolyethylene glycol-polypropylene glycol acrylates or their mixtures, aminoalkyl acrylates, such as 2-(dimethylamino)ethyl acrylate (ADAME), fluoroacrylates, silylated acrylates, phosphorus-comprising acrylates, such as alkylene glycol acrylate phosphates, glycidyl acrylate or dicyclopentenyloxyethyl acrylate, methacrylic monomers, such as methacrylic acid or its salts, alkyl, cycloalkyl, alkenyl or aryl methacrylates, such as methyl (MMA), lauryl, cyclohexyl, allyl, phenyl or naphthyl methacrylate, hydroxyalkyl methacrylates, such as 2-hydroxyethyl methacrylate or 2-hydroxypropyl methacrylate, ether alkyl methacrylates, such as 2-ethoxyethyl methacrylate, alkoxy- or aryloxypolyalkylene glycol methacrylates, such as methoxypolyethylene glycol methacrylates, ethoxypolyethylene glycol methacrylates, methoxypolypropylene glycol methacrylates, methoxypolyethylene glycol-polypropylene glycol methacrylates or their mixtures, aminoalkyl methacrylates, such as 2-(dimethylamino)ethyl methacrylate (MADAME), fluoromethacrylates, such as 2,2,2-trifluoroethyl methacrylate, silylated methacrylates, such as 3-methacryloyloxypropyltrimethylsilane, phosphorus-comprising methacrylates, such as alkylene glycol methacrylate phosphates, hydroxyethylimidazolidone methacrylate, hydroxyethylimidazolidinone methacrylate or 2-(2-oxo-1-imidazolidinyl)ethyl methacrylate, acrylonitrile, acrylamide or substituted acrylamides, 4-acryloylmorpholine, N-methylolacrylamide, methacrylamide or substituted methacrylamides, N-methylolmethacrylamide, methacrylamidopropyltrimethylammonium chloride (MAPTAC), glycidyl methacrylate, dicyclopentenyloxyethyl methacrylate, itaconic acid, maleic acid or its salts, maleic anhydride, alkyl or alkoxy- or aryloxypolyalkylene glycol maleates or hemimaleates, vinylpyridine, vinylpyrrolidinone, (alkoxy)poly(alkylene glycol) vinyl ethers or divinyl ethers, such as methoxypoly(ethylene glycol) vinyl ether or poly(ethylene glycol) divinyl ether, olefinic monomers, among which may be mentioned ethylene, butene, hexene and 1-octene, diene monomers, including butadiene or isoprene, as well as fluoroolefinic monomers and vinylidene monomers, among which may be mentioned vinylidene fluoride, alone or as a mixture of at least two abovementioned monomers.

Preferably, the polymers consist of a blend, on the one hand, of diblock copolymer, one of the blocks of which comprises styrene and the other block of which comprises methylmethacrylate, and, on the other hand, of a (co)polymer which comprises styrene.

More preferably, the polymers consist of a blend of PS-b-PMMA diblock copolymer and of PS homopolymer.

On conclusion of the formation of the first block, a portion of this block can be deactivated, for example by introducing, for example, an acid in a controlled amount. The synthesis of the other blocks can then be continued while retaining a portion of the deactivated first block.

When the polymerization process is carried out by an anionic route, which is the preferred route used in the invention, any anionic polymerization mechanism can be considered, whether ligated anionic polymerization or ring-opening anionic polymerization. For each process used, care will be taken to adjust the amount of (co)polymer in the (co)polymer/block copolymer blend by deactivating a portion of the block synthesized in the first stage.

In the preferred context of the invention, use will be made of an anionic polymerization process in a nonpolar solvent and preferably toluene, as described in European Patent EP 0 749 987, and which involves a micromixer. Preference will be given to the monomers chosen from the following entities: at least one vinyl, vinylidene, diene, olefinic, allyl or (meth)acrylic monomer. These monomers are more particularly chosen from vinylaromatic monomers, such as styrene or substituted styrenes, in particular α-methylstyrene, acrylic monomers, such as alkyl, cycloalkyl or aryl acrylates, such as methyl, ethyl, butyl, ethylhexyl or phenyl acrylate, ether alkyl acrylates, such as 2-methoxyethyl acrylate, alkoxy- or aryloxypolyalkylene glycol acrylates, such as methoxypolyethylene glycol acrylates, ethoxypolyethylene glycol acrylates, methoxypolypropylene glycol acrylates, methoxypolyethylene glycol-polypropylene glycol acrylates or their mixtures, aminoalkyl acrylates, such as 2-(dimethylamino)ethyl acrylate (ADAME), fluoroacrylates, silylated acrylates, phosphorus-comprising acrylates, such as alkylene glycol acrylate phosphates, glycidyl acrylate or dicyclopentenyloxyethyl acrylate, alkyl, cycloalkyl, alkenyl or aryl methacrylates, such as methyl (MMA), lauryl, cyclohexyl, allyl, phenyl or naphthyl methacrylate, ether alkyl methacrylates, such as 2-ethoxyethyl methacrylate, alkoxy- or aryloxypolyalkylene glycol methacrylates, such as methoxypolyethylene glycol methacrylates, ethoxypolyethylene glycol methacrylates, methoxypolypropylene glycol methacrylates, methoxypolyethylene glycol-polypropylene glycol methacrylates or their mixtures, aminoalkyl methacrylates, such as 2-(dimethylamino)ethyl methacrylate (MADAME), fluoromethacrylates, such as 2,2,2-trifluoroethyl methacrylate, silylated methacrylates, such as 3-methacryloyloxypropyltrimethylsilane, phosphorus-comprising methacrylates, such as alkylene glycol methacrylate phosphates, hydroxyethylimidazolidone methacrylate, hydroxyethylimidazolidinone methacrylate or 2-(2-oxo-1-imidazolidinyl)ethyl methacrylate, acrylonitrile, acrylamide or substituted acrylamides, 4-acryloylmorpholine, N-methylolacrylamide, methacrylamide or substituted methacrylamides, N-methylolmethacrylamide, methacrylamidopropyltrimethylammonium chloride (MAPTAC), glycidyl methacrylate, dicyclopentenyloxyethyl methacrylate, maleic anhydride, alkyl or alkoxy- or aryloxypolyalkylene glycol maleates or hemimaleates, vinylpyridine, vinylpyrrolidinone, (alkoxy)poly(alkylene glycol) vinyl ethers or divinyl ethers, such as methoxypoly(ethylene glycol) vinyl ether or poly(ethylene glycol)divinyl ether, olefinic monomers, among which may be mentioned ethylene, butene, hexene and 1-octene, diene monomers, including butadiene or isoprene, as well as fluoroolefinic monomers and vinylidene monomers, among which may be mentioned vinylidene fluoride, alone or as a mixture of at least two abovementioned monomers.

According to an alternative form of the invention, consideration will be given to blends of (co)polymer and block copolymer, one of the blocks of which comprises styrene and at least one comonomer X, the other block comprising methyl methacrylate and at least one comonomer Y, X being chosen from the following entities: styrene, which is hydrogenated or partially hydrogenated, cyclohexadiene, cyclohexene, cyclohexane, styrene substituted by one or more fluoroalkyl groups, or their mixtures, in proportions by weight of X ranging from 1% to 99% and preferably from 10% to 20%, with respect to the block comprising styrene; Y being chosen from the following entities: fluoroalkyl(meth)acrylate, particularly trifluoroethyl methacrylate, dimethylaminoethyl (meth)acrylate, globular (meth)acrylates, such as isobornyl (meth)acrylate or halogenated isobornyl(meth)acrylate, halogenated alkyl(meth)acrylate, naphthyl(meth)acrylate, polyhedral oligomeric silsesquioxane(meth)acrylates which can comprise a fluorinated group, or their mixtures, in proportions by weight of Y ranging from 1% to 99% and preferably from 10% to 20%, with respect to the block comprising methyl methacrylate, it being understood that the (co)polymer will be identical to one of the blocks of the block copolymer as it results from partial deactivation of the block obtained in the first stage of the synthesis.

In the context of the anionic polymerization process as described in Patent EP 0 749 987, the deactivation of a portion of the first block is obtained either by adjusting the temperature, or by modifying the polarity of the medium, or by modifying the residence times, or a combination of these parameters. The deactivation can also occur in part in the second stage, during the reinitiation of the second block, as a function of the monomer or monomers chosen. For example, during the reinitiation with methyl methacrylate (second stage of the synthesis), only approximately 80% of the chains of the first block will be reinitiated. This parameter remains fixed with a given pair of monomers. The desired adjustment will be carried out on the first stage of the synthesis.

An increase in temperature during the synthesis of the first block will be accompanied by an increase in the proportion of deactivated block.

The proportion of the first deactivated block will also increase as the residence times increase.

Finally, the polarity will also make it possible to control the proportion of deactivated block. A polar solvent, such as THF, anisole or dioxane, or any other cyclic ether, and preferably THF, will then be added to the nonpolar solvent.

Preferably, the proportion of the first block is controlled by adjusting the temperature for a given time of residence time. In the case of a PS-b-PMMA diblock, it has been shown that a fine adjustment of the deactivated chains can be carried out by varying the temperature of synthesis of the first block (the PS block) for a residence time of 10 minutes, according to the following equation:

$$\% \text{ of deactivated chains} = -0.015T^2 + 2.45T - 83,$$

where T is the temperature, expressed in ° C.

For another pair of monomers, or another residence time, a preliminary calibration makes it possible to establish the constants of this equation.

Another way of controlling the proportion of deactivated block will be to add a protic solvent, typically an alcohol, water or an acid, preferably an alcohol, each proton originating from the proton donor deactivating one chain. However, it is not preferable to operate in this way as the reaction is violent for precise control of the targeted deactivation.

The parameters which make it possible to adjust the proportion of deactivated block will be determined as a function of the monomers chosen and graphs will be constructed to this end.

Preferably, the polymers consist of a blend, on the one hand, of diblock copolymer, one of the blocks of which comprises styrene and the other block of which comprises methyl methacrylate, and, on the other hand, of a (co)polymer which comprises styrene.

More preferably, the polymers consist of a blend of PS-b-PMMA diblock copolymer and of PS homopolymer.

For a block copolymer comprising blocks A and blocks B, the ratios by weight between the blocks will be between 50/50 and 95/5 and preferably between 50/50 and 80/20 (limits included, whatever the predominant block).

The block copolymer/(co)polymer ratios will be between 100/0 and 30/70 by weight in the final blend, more preferably between 99/1 and 50/50, more preferably between 90/10 and 70/30 and more preferably still between 80/20 and 70/30.

The peak molecular weights of the block copolymer and of the (co)polymer, taken separately, will be between 2500 and 300 000 g/mol and preferably between 25 000 and 170 000 g/mol, measured by SEC using polystyrene standards.

The dispersity indices of the block copolymer and of the (co)polymer, taken separately, will be between 1.02 and 2.5 and preferably between 1.1 and 1.5.

According to an alternative form of the invention, an additional stage is carried out on conclusion of the synthesis of the blend of the polymers, which stage is targeted at extracting a portion of the (co)polymer. In this particular case, the blend resulting from the synthesis is poured into a solution consisting of a solvent for the (co)polymer and a nonsolvent for the block copolymer. This operation may be necessary when the proportion of (co)polymer of the first block is too high.

In the case of a synthesis of PS-b-PMMA and of PS homopolymer, a cyclohexane/heptane mixture with a ratio by volume of 80/20 is chosen as solvent which precipitates the block copolymer PS-b-PMMA. The PS homopolymer can, if appropriate, be subsequently reused.

The blend of polymers can be used in various application processes, such as lithography (lithography masks), the manufacture of membranes, the functionalization and coating of surfaces, the manufacture of inks and composites, the nanostructuring of surfaces or the manufacture of transistors, diodes or memory points of organic nature.

The invention relates in particular to the use of the process which is the subject-matter of the invention to manufacture lithography masks and also to the masks obtained.

The process of the invention makes it possible to obtain films with fewer defects, whether defects of orientation of the block copolymers deposited, defects of coordination number or defects of distance. Thus, the process of the invention makes possible the manufacture of films with greater monocrystalline surfaces compared with those obtained with a block copolymer alone of low dispersity (typically less than 1.1). The term "monocrystalline surface" is understood to mean a surface where the morphology of the block copolymer (if appropriate in the presence of homopolymer of one of the blocks) deposited is perfectly ordered, without defect of orientation, of distance or of coordination number, exhibiting a long-range periodical or quasiperiodical translational order, typically several times the intrinsic period/unit cell of the block copolymer (if appropriate in the presence of homopolymer of one of the blocks), whatever the chosen direction of the surface, and the boundary of which is delimited by defects, whether they are defects of orientation, of distance or of coordination number.

In the case of lithography, the desired structuring (for example, generation of the domains perpendicular to the surface) requires, however, the preparation of the surface on which the blend of polymers is deposited for the purpose of controlling the surface energy. Among the known possibilities, a random copolymer, the monomers of which can be identical, in all or part, to those used in the block copolymer which it is desired to deposit, is deposited on the surface. In a pioneering article, Mansky et al. (Science, Vol. 275, pages 1458-1460, 1997) clearly describes this technology, now well known to a person skilled in the art.

Mention may be made, among the favoured surfaces, of surfaces consisting of silicon, the silicon exhibiting a native or thermal oxide layer, germanium, platinum, tungsten, gold, titanium nitrides, graphenes, BARC (bottom antireflecting coating) or any other antireflective layer used in lithography.

The surfaces may be said to be "free" (flat and homogeneous surface, both from a topographical and from a chemical viewpoint) or can exhibit structures for guidance of the block copolymer "pattern", whether this guidance is of the chemical guidance type (known as "guidance by chemical epitaxy") or physical/topographical guidance type (known as "guidance by graphoepitaxy").

Once the surface has been prepared, a solution of the polymer blend is deposited and then the solvent is evaporated according to techniques known to a person skilled in the art, such as, for example, the spin coating, doctor blade, knife system or slot die system technique, but any other technique can be used, such as dry deposition, that is to say deposition without involving a predissolution.

A heat treatment or treatment by solvent vapour, which treatment allows the blend of polymers to become correctly organized, a combination of the two treatments, or any other treatment known to a person skilled in the art which allows the mixture to become correctly organized, is subsequently carried out.

In the case of the system consisting of PS-b-PMMA with the PS homopolymer, the inventors have found that it is preferable to use blends comprising more than 20% of homopolymer. This makes it possible to obtain a perpendicular assembly (for example, perpendicular cylinders) without defects for greater film thicknesses than those obtained using the block copolymer alone, typically greater than or equal to 40 nm but less than 400 nm and preferably between 40 and 150 nm. This makes possible better control of the lithography process as the transfer of the nanostructured patterns into the substrate by etching (dry or wet) is strongly dependent on the thickness of the films used as masks: films having a thickness of less than 40 nm will not make possible efficient transfer into the substrate, whereas thicker films will result in greater aspect ratios.

The following examples illustrate the scope of the invention, without implied limitation:

EXAMPLE 1

Syntheses of a PS-b-PMMA diblock copolymer and of blends of PS-b-PMMA diblock copolymer with PS homopolymer.

The equipment for the polymerization used is represented diagrammatically in FIG. 1. A solution of the macroinitiating system is prepared in a vessel C1 and a solution of the monomer in a vessel C2. The stream from the vessel C2 is sent to an exchanger E in order to be brought to the initial polymerization temperature. The two streams are subsequently sent to a mixer M, which, in this example, is a micromixer, as described in European Patent Application EP 0 749 987, and then to the polymerization reactor R, which is a conventional tubular reactor. The product is received in a vessel C3 and is subsequently transferred into a vessel C4 in order to be precipitated therein.

A 21.1% by weight solution in toluene at 45° C. of the macroinitiator system poly(styryl)CH$_2$C(Ph)$_2$Li/CH$_3$OCH$_2$CH$_2$OLi with a molar ratio of 1/6 to 9.8×10$^{-2}$ mol of poly(styryl)CH$_2$C(Ph)$_2$Li, as is described in EP 0 749 987 and EP 0 524 054, is prepared in the vessel C1.

A solution of MMA which has passed over a molecular sieve, at 9% by weight in toluene, is stored at −15° C. in the vessel C2.

The final copolymer content targeted is 16.6% by weight. The vessel C1 is cooled to −20° C. and the stream of the solution of the macroinitiator system is adjusted to 60 kg/h. The stream of the MMA solution from the vessel C2 is sent to an exchanger in order for the temperature to be lowered therein to −20° C. and the stream of the MMA solution is adjusted to 34.8 kg/h. The two streams are subsequently blended in the static mixer and then recovered in a vessel C3 where the copolymer is deactivated by the addition of a methanol solution.

The conversion, determined by measuring the solids content, is greater than 99%. At this stage, the amount of homopolymer can vary. In this particular case, it is 25%.

The amount of PS homopolymer can be adjusted as a function of the temperature for a residence time of 10 minutes in C1 according to the following relationship:

% of deactivated chains=−0.015$T^2$+2.45$T$−83, where T is the temperature, expressed in ° C.; the % of deactivated chains corresponds to the fraction of adjustable PS homopolymer. This amount will be added to the amount not reinitiated by the methyl methacrylate.

Figure 2:
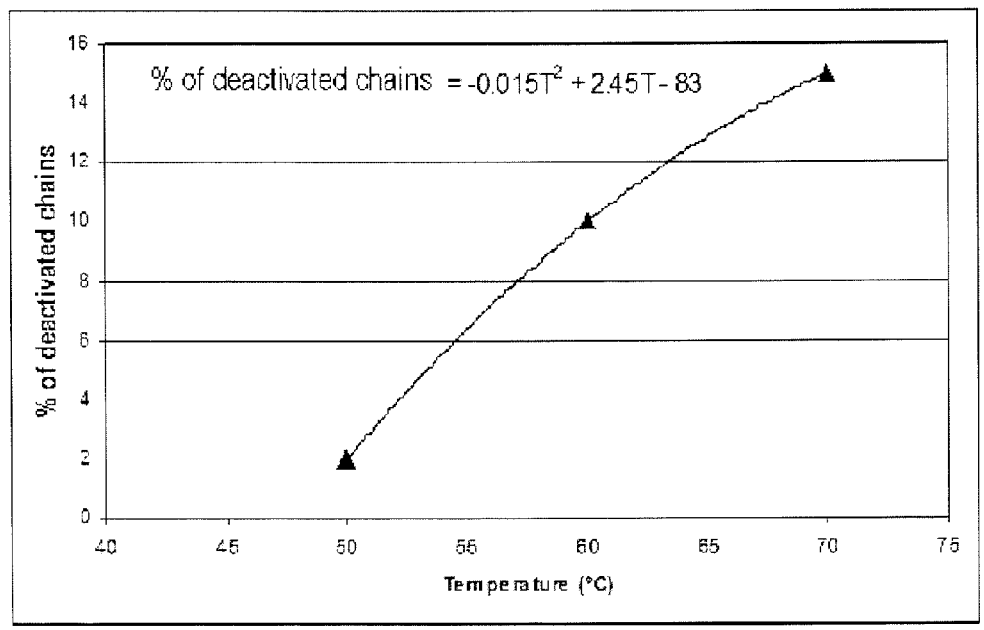
FIG. 2 illustrates certain experimental data obtained in Example 2 (% of deactivated chains v. temperature).

This relationship is drawn up from the experimental curve of FIG. 2.

When the content of PS homopolymer is too high, the contents of the vessel C3 are precipitated dropwise in a vessel C4 with stirring. The vessel contains an 80/20 mixture by volume of cyclohexane/heptane and the ratio by volume of the contents of the vessel C3 to the contents of C4 is 1/7. At the end of the addition of the solution from the vessel C3, stirring is halted and the block copolymer settles out. It is subsequently recovered by removal of the supernatant and filtration. The cyclohexane/heptane ratio makes it possible to adjust the amount of homopolymer in the blend. In this particular case, a blend of polymers comprising only traces of PS homopolymer is obtained in the precipitated part.

After drying, the characteristics of the block copolymer are as follows:
Mn=61.4 kg/mol
Mw/Mn=1.09
PS/PMMA ratio by weight=66.3/33.7

The measurements are carried out by SEC using polystyrene standards, with double detection (refractometric and UV), the UV detection making it possible to calculate the proportion of PS.

EXAMPLE 2

Syntheses of the copolymer making possible the neutralization of the surface.

Preparation of a hydroxy-functionalized alkoxyamine starting from the commercial alkoxyamine BlocBuilder®MA available from Arkema:

The following are introduced into a 1 l round-bottom flask purged with nitrogen:
226.17 g of BlocBuilder®MA (1 equivalent)
68.9 g of 2-hydroxyethyl acrylate (1 equivalent)
548 g of isopropanol The reaction mixture is heated at reflux (80° C.) for 4 h and then the isopropanol is evaporated under vacuum. 297 g of hydroxy-functionalized alkoxyamine are obtained in the form of a very viscous yellow oil.

Preparation of polystyrene/polymethyl methacrylate random copolymer starting from the hydroxy-functionalized alkoxyamine.

The toluene and also the monomers, such as styrene (S) and methyl methacrylate (MMA), and the hydroxy-functionalized alkoxyamine are introduced into a jacketed stainless steel reactor equipped with a mechanical stirrer. The ratios by weight between the various monomers, styrene (S) and methyl methacrylate (MMA), are described in Table 1. The toluene charge by weight is set at 30%, with respect to the reaction medium. The reaction mixture is stirred and degassed by bubbling with nitrogen at ambient temperature for 30 minutes.

The temperature of the reaction medium is then brought to 115° C. The time t=0 is triggered at ambient temperature. The temperature is maintained at 115° C. throughout the polymerization until a conversion of the monomers of the order of 70% is achieved. Samples are withdrawn at regular intervals in order to determine the polymerization kinetics by gravimetric analysis (measurement of solids content).

When the conversion of 70% is achieved, the reaction medium is cooled to 60° C. and the solvent and residual monomers are evaporated under vacuum. After evaporation, methyl ethyl ketone is added to the reaction medium in an amount such that a polymer solution of the order of 25% by weight is produced.

This polymer solution is then introduced dropwise into a beaker containing a nonsolvent (heptane), so as to precipitate the polymer. The ratio by weight of solvent to nonsolvent (methyl ethyl ketone/heptane) is of the order of 1/10. The precipitated polymer is recovered in the form of a white powder after filtration and drying.

TABLE 1

| | Initial reaction state | | | | | | |
|---|---|---|---|---|---|---|---|
| | Initial composition by weight of the monomers S/MMA | Ratio by weight of initiator with respect to the monomers S and MMA | Characteristics of the copolymer | | | | |
| | | | % PS[a] | Mp[a] | Mn[a] | Mw[a] | PI[a] |
| PS/PMMA copolymer | 74/26 | 0.03 | 73% | 15 040 | 12 280 | 15 400 | 1.2 |

[a] Determined by steric exclusion chromatography. The polymers are dissolved at 1 g/l in BHT-stabilized THF. The calibration is carried out by virtue of monodisperse polystyrene standards. The double detection by refractive index and UV at 254 nm makes it possible to determine the percentage of polystyrene in the polymer.

EXAMPLE 3

Grafting to $SiO_2$.

Silicon wafers (crystallographic orientation {100}) are cut up manually into 3×4 cm pieces and cleaned by piranha treatment ($H_2SO_4/H_2O_2$ 2:1 (v:v)) for 15 minutes, then rinsed with deionized water and dried under a stream of nitrogen immediately before functionalization. The continuation of the procedure is that described by Mansky et al. (*Science*, 1997, 1458), with just one modification (the annealing is carried out under ambient atmosphere and not under vacuum). The random polymers are dissolved in toluene in order to obtain 1.5% by weight solutions. A solution of random copolymer prepared in Example 2 is dispensed by hand over a freshly cleaned wafer and then spread by spin coating at 700 rpm in order to obtain a film with a thickness of approximately 90 nm. The substrate is then simply deposited on a heating plate, brought beforehand to the desired temperature, under ambient atmosphere for a variable time. The substrate is then washed by sonication in several toluene baths for a few minutes, in order to remove the ungrafted polymer from the surface, and then dried under a stream of nitrogen.

EXAMPLE 4

Deposition of the block copolymer on the surface treated in Example 3.

The polymer blend to be deposited is dissolved in propylene glycol monomethyl ether acetate at a concentration of 1.5% by weight.

This solution is deposited by spin coating over the treated surface from Example 4 and then a thermal annealing is carried out at 230° C. for at least 5 minutes in order to evaporate the solvent and to leave time for the morphology to become established.

EXAMPLE 5

Influence of the composition of the blend on the thickness of the deposited film.

In this example, a comparison is carried out between the thicknesses of films obtained either with a pure PS-b-PMMA diblock copolymer with a peak molecular weight Mp of 86.2 g/mol or with a blend of PS-b-PMMA diblock copolymer with a peak molecular weight Mp of 71.7 g/mol and of PS homopolymer having an unchanging PS composition (respectively 69.5% and 69.2%, measured by proton NMR).

Figure 3:
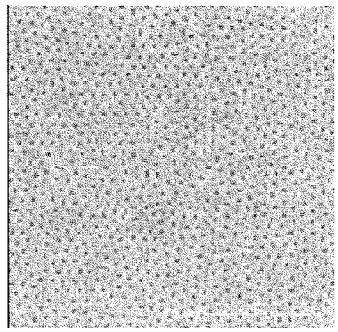
FIGS. 3 and 4 illustrate certain experimental results obtained in Example 5.
Figure 4:
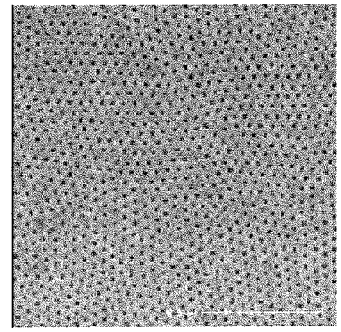

In both cases, a cylindrical morphology is obtained, with a period respectively of 43.2 nm and 43.07 nm, but, in the case of the blend, the thickness of the defect-free film is 47 nm versus 30 nm with the pure PS-b-PMMA diblock copolymer (FIGS. 3 and 4).

EXAMPLE 6

Influence of the amount of PS homopolymer in the blend of PS-b-PMMA block copolymer and PS homopolymer.

Figure 5:
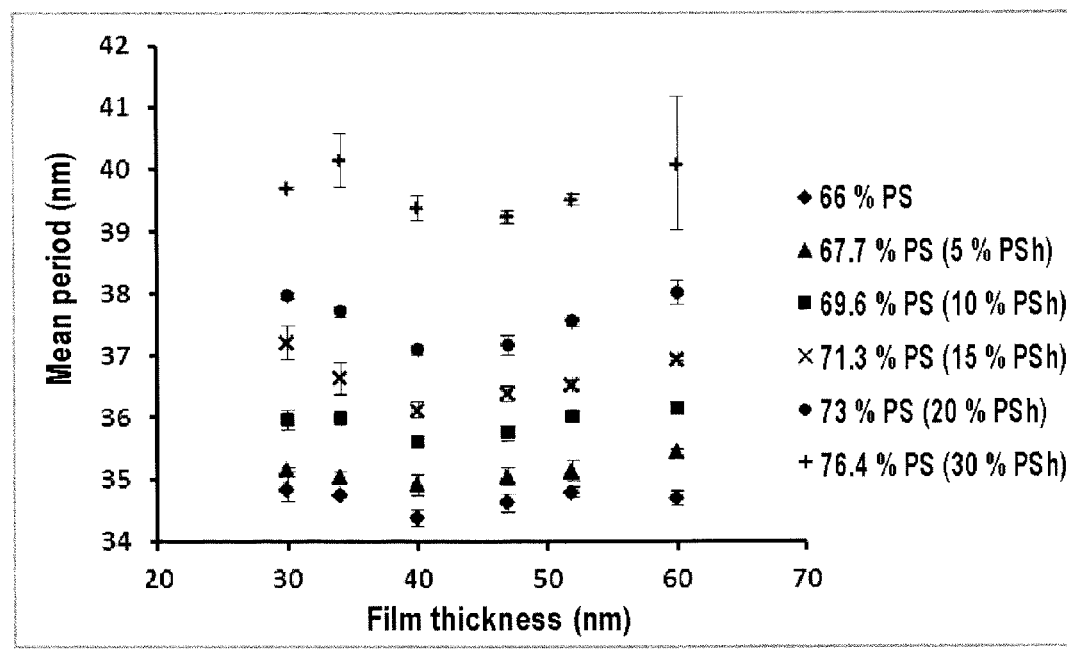
FIG. 5 shows the relationship between mean period and film thickness, as measured in Example 6.
Figure 6:
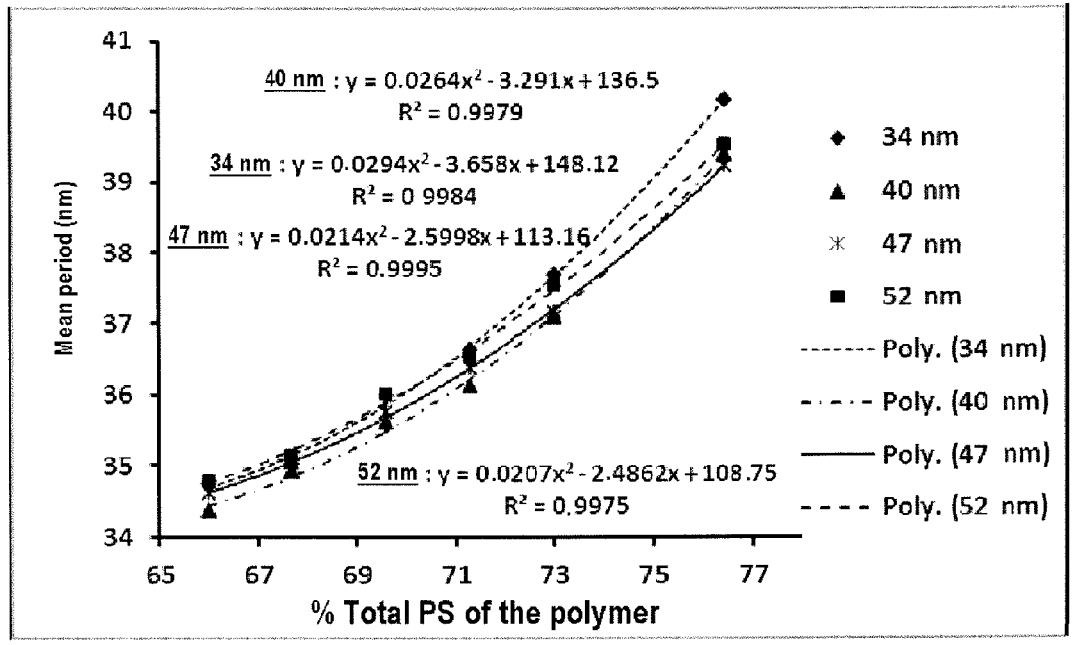
FIG. 6 presents the change in the mean period as a function of the total amount of PS present in the blend of polymers of Example 6.
Figure 7:
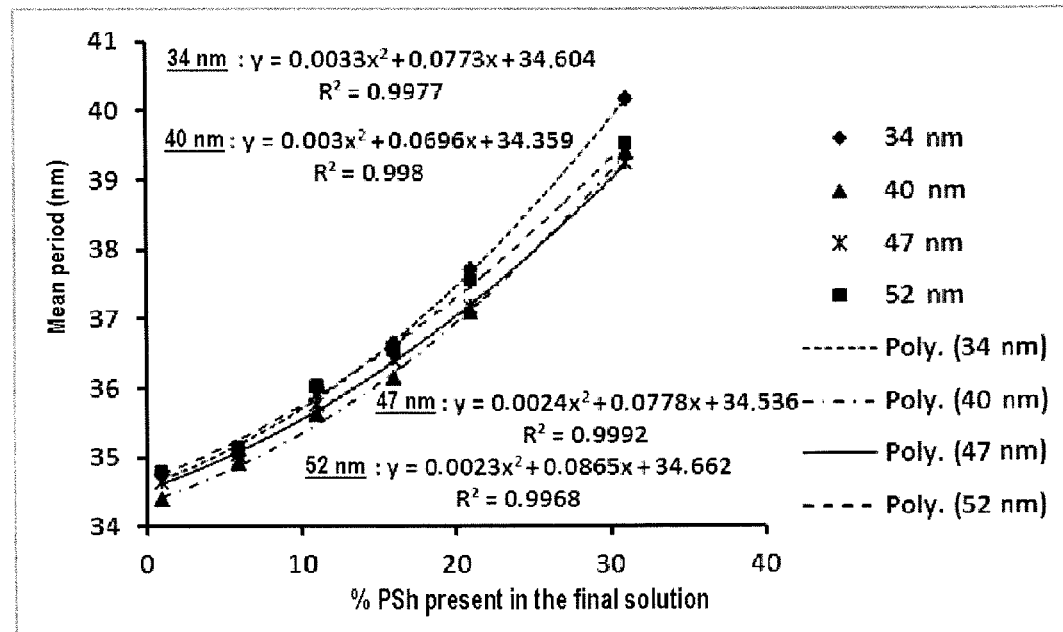
FIG. 7 presents the same conclusions of Example 6 but as a function of the content of homopolymer present in the final solution.

Starting from PS-b-PMMA diblock comprising different contents of PS homo prepared according to Example 1, and the deposition of these blends according to Example 5, it is possible to visualize, in FIGS. 5, 6 and 7, the results obtained in terms of period characterizing the morphology L0, as a function of the content of PS homopolymer and of the thickness of the films deposited. A variation in the period which becomes greater as the content of PS homopolymer increases and which does not vary by much as a function of the thickness of the film deposited is observed (FIG. 5).

FIGS. 6 and 7 are a different presentation of the same results. FIG. 6 presents the change in the period as a function of the total amount of PS present in the blend of polymers for different film thicknesses (34, 40, 47 and 52 nm) and their polynomial regression (Poly.34 nm, Poly.40 nm, Poly.47 nm and Poly.52 nm).

FIG. 7 presents the same conclusions but as a function of the content of homopolymer present in the final solution (% PSh).

EXAMPLE 7

This example illustrates the influence of the presence of PS homo on the defectiveness of the films. The comparison is made between a pure block copolymer with a period of 32.2 nm and a block copolymer blended with 10% of PS homo, so that the mixture exhibits a very similar period, typically 33.5 nm. The blends are prepared from solutions of block copolymer and of PS homo, typically, in this example, 9/1 block copolymer/PS homo volume/volume.

Figure 8:
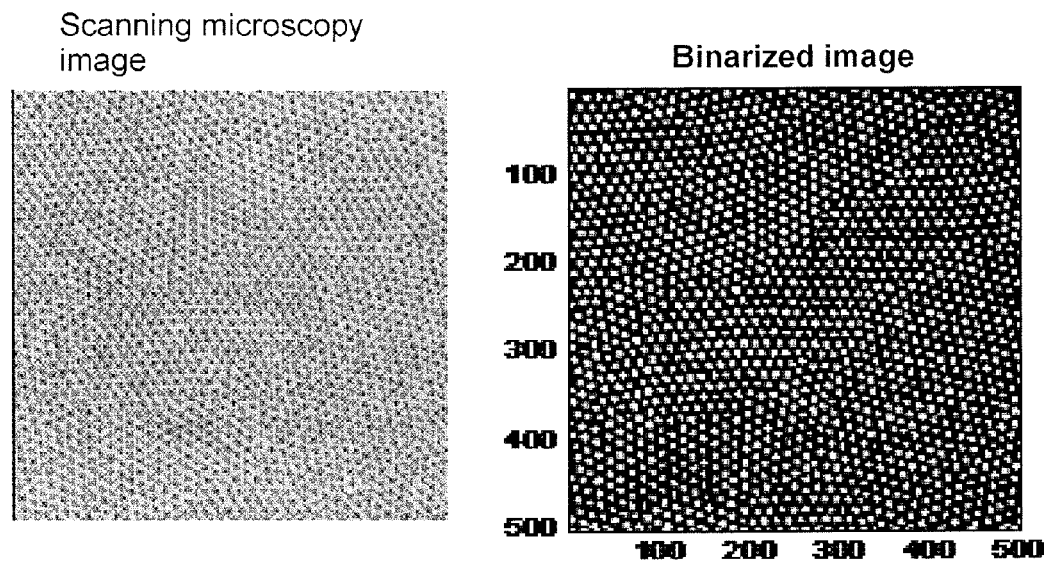
FIG. 8 illustrates the SEM and binarized images obtained with the block copolymer alone in Example 7.
Figure 9:
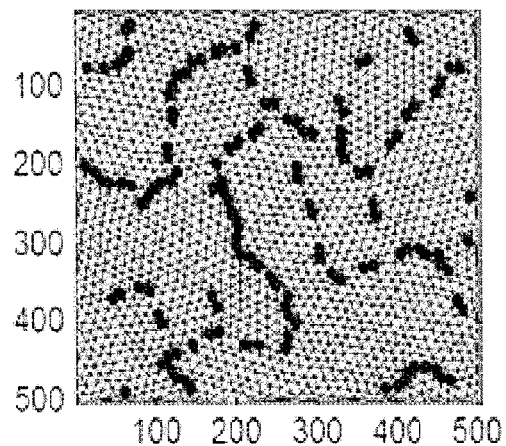
FIG. 9 illustrates the defects of coordination number and of distance and also their number which are in association with FIG. 8.
Figure 9:
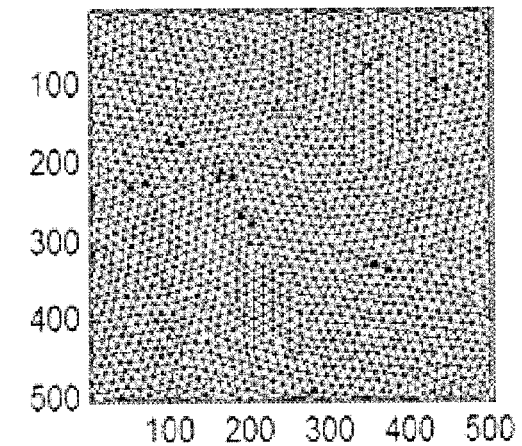

By following the technique described in the description for the measurement of the different defects of coordination number and of distance, FIG. 8 illustrates the SEM and binarized images obtained with the block copolymer alone and FIG. 9 the defects of coordination number and of distance and also their number which are in association with FIG. 8. In this case, 140 defects of coordination number and 16 defects of distance are counted.

Figure 10:
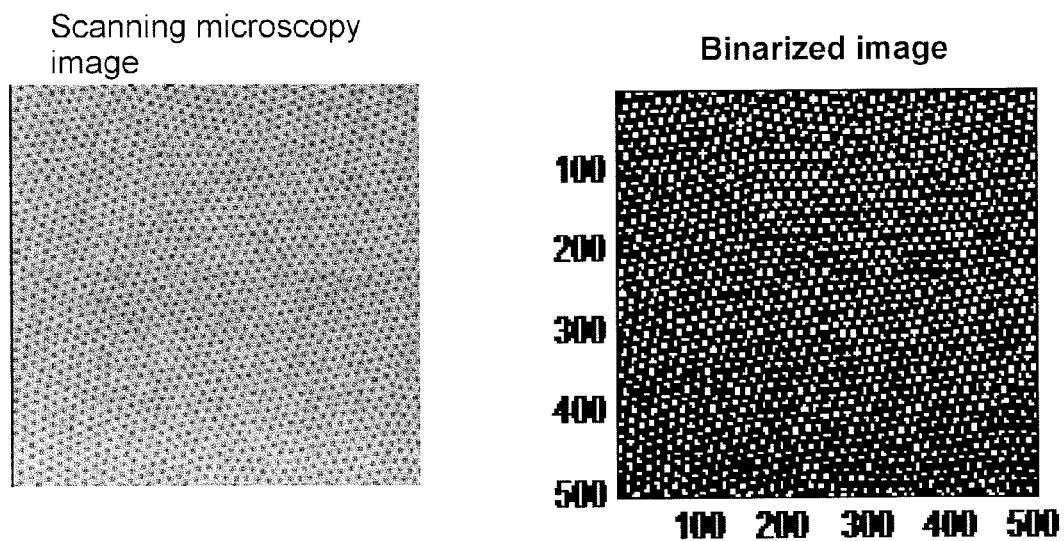
FIG. 10 illustrates the SEM and binarized images obtained with the block copolymer/PS homo blend of Example 7.
Figure 11:
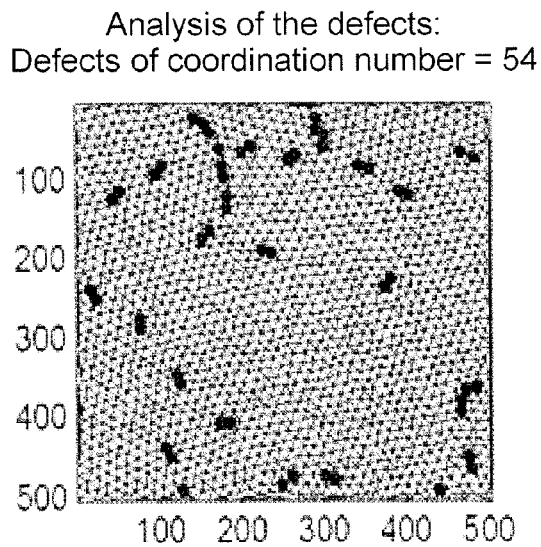
FIG. 11 illustrates the defects of coordination number and of distance and also their number which are in association with FIG. 10.
Figure 11:
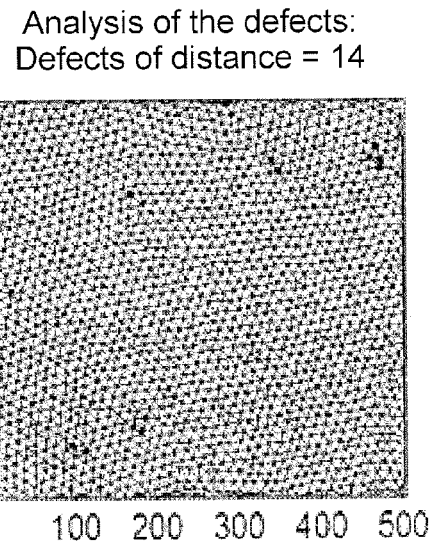

FIG. 10 illustrates the SEM and binarized images obtained with the block copolymer/PS homo blend and FIG. 11 the defects of coordination number and of distance and also their number which are in association with FIG. 10. In this case, 54 defects of coordination number and 14 defects of distance are counted.

The influence of the presence of PS homo on the block copolymer/PS homo blend is clearly demonstrated by a very significant decrease in the defects of coordination number but also a decrease in the defects of distance.

Characterizations:

The images obtained by scanning electron microscopy were recorded on a CD-SEM H9300 from Hitachi.

The film thickness measurements were carried out on a Prometrix UV1280 ellipsometer.

What is claimed is:

1. A process for controlling the period characterizing the morphology obtained starting from a blend of block copolymers and of (co)polymers of one of the blocks in thin films, comprising the following stages:
   a) synthesizing a block copolymer so that the product of the synthesis comprises the said block copolymer and a (co)polymer of one of the blocks;
   b) depositing a solution of the blend of the block copolymer and of the (co)polymer on a surface;
   c) evaporating the solvent; and
   d) annealing;
additionally comprising a purification stage targeted at reducing the amount of (co)polymer.

2. The process according to claim 1, wherein the process provides thin films having decreased defects of orientation, decreased defects of coordination number, and decreased defects of distance and greater monocrystalline surfaces.

3. The process according to claim 1, wherein the synthesizing stage is carried out by controlled radical polymerization.

4. The process according to claim 1, wherein the synthesizing stage is carried out by anionic polymerization.

5. The process according to claim 4, wherein the anionic polymerization is carried out batchwise for the synthesis of the first block and continuously using a micromixer for the synthesis of the second block.

6. The process according to claim 5, wherein the proportion of the first active block is adjusted by adjustment of the temperature.

7. The process according to claim 1, wherein the block copolymer is a diblock copolymer, the ratios by weight of the blocks of which are between 50/50 and 95/5.

8. The process according to claim 1, wherein the block copolymer/(co)polymer ratios are between 99/1 and 50/50.

9. The process according to claim 1, wherein the blend of copolymers consists of a blend, on the one hand, of diblock copolymer, one of the blocks of which comprises styrene and the other block of which comprises methyl methacrylate, and, on the other hand, of a (co)polymer which comprises styrene.

10. The process according to claim 9, wherein the blend of copolymers consists of a blend of PS-b-PMMA diblock copolymer and of PS homopolymer.

11. The process according to claim 10, wherein the proportion of PS homopolymer is adjusted by a combination of the residence time and of the temperature.

12. The process according to claim 1, wherein the peak molecular weights of the block copolymer and of the (co)polymer, taken separately, are between 2500 and 300 000 with a dispersity index of between 1.02 and 2.5.

13. The process according to claim 1, wherein the thickness of the film is greater than 40 nm and less than 400 nm.

14. The process according to claim 1, wherein the surface is flat and homogeneous.

15. The process according to claim 1, wherein the surface exhibits guidance structures.

16. The process according to claim 1, wherein the annealing is carried out by a heat treatment.

17. The process according to claim 1, wherein the annealing is carried out by a treatment in solvent vapour.

18. The process according to claim 1, wherein the annealing is carried out by a combination of a heat treatment and of a solvent vapour treatment.

* * * * *